US006892172B1

(12) United States Patent
Singh et al.

(10) Patent No.: US 6,892,172 B1
(45) Date of Patent: May 10, 2005

(54) CUSTOMIZABLE SIMULATION MODEL OF AN ATM/SONET FRAMER FOR SYSTEM LEVEL VERIFICATION AND PERFORMANCE CHARACTERIZATION

(76) Inventors: Raj Kumar Singh, 404 Legault Dr., Cary, NC (US) 27513-8326; Laura Ann Weaver, 113 Garden Gate Dr., Chapel Hill, NC (US) 27516

(*) Notice: Subject to any disclaimer, the term of this patent is extended or adjusted under 35 U.S.C. 154(b) by 0 days.

(21) Appl. No.: 09/505,748

(22) Filed: Feb. 16, 2000

(51) Int. Cl.[7] ............................................. G06F 17/50

(52) U.S. Cl. ........................................................ 703/14

(58) Field of Search ............................. 703/14, 13, 19; 707/4; 716/1, 4, 6; 710/305; 709/230, 223, 224, 236; 370/397, 395.51, 465, 466, 907

(56) References Cited

U.S. PATENT DOCUMENTS

| | | | |
|---|---|---|---|
| 5,375,070 A | | 12/1994 | Hershey et al. ............. 364/500 |
| 5,544,066 A | | 8/1996 | Rostoker et al. ............ 364/489 |
| 5,715,432 A | | 2/1998 | Xu et al. .................... 395/500 |
| 5,745,386 A | | 4/1998 | Wile et al. .................. 364/578 |
| 5,781,320 A | | 7/1998 | Byers ......................... 395/123 |
| 5,802,073 A | * | 9/1998 | Platt ........................... 714/733 |
| 5,920,711 A | | 7/1999 | Seawright et al. .......... 395/500 |
| 5,978,377 A | * | 11/1999 | Kim et al. ................... 370/397 |
| 5,991,270 A | * | 11/1999 | Zwan et al. ................. 370/249 |
| 6,026,088 A | * | 2/2000 | Rostoker et al. ....... 370/395.53 |
| 6,053,947 A | * | 4/2000 | Parson ......................... 703/14 |
| 6,075,788 A | * | 6/2000 | Vogel ..................... 370/395.51 |
| 6,108,309 A | * | 8/2000 | Cohoe et al. ................ 370/241 |
| 6,349,297 B1 | * | 2/2002 | Shaw et al. ..................... 707/4 |
| 6,415,325 B1 | * | 7/2002 | Morrien ....................... 709/230 |
| 6,470,482 B1 | * | 10/2002 | Rostoker et al. ............... 716/6 |
| 6,477,683 B1 | * | 11/2002 | Killian et al. ................. 716/1 |
| 6,668,297 B1 | * | 12/2003 | Karr et al. ................... 710/305 |

OTHER PUBLICATIONS

Kim et al., "Design and simulation of three ATM ASICs", The first IEEE Asia Pacific conference on ASICs, Aug. 1999.*

Bagheri et al., "10 Gb/s framer/demultiplexer IC for SONET STS–192 applications", Proceedings of the IEEE 1995 custom integrated circuits conference, May 1995.*

Koziotis et al., "0.6/spl mu/m CMOS, 622/155 mbit/s ATM–SDH/SONET framer IC", IEEE, Electronics letters, Oct. 1999.*

Johnston et al., "The ATM chip layer: an ASIC for B–ISDN applications", IEEE Journal on Selected areas in communications, Jun. 1991.*

(Continued)

*Primary Examiner*—Kevin J. Teska
*Assistant Examiner*—Kandasamy Thangavelu
(74) *Attorney, Agent, or Firm*—Joscelyn G. Cockburn

(57) ABSTRACT

This system represents a customizable simulation model of an ATM/SONET Framer for System Level Verification and Performance-Characterization. An Asynchronous Transfer Mode (ATM) data processing ASIC interfaces with a Media Access Control (MAC) device that presents an electrical data path interface, called Universal Test & Operations PHY Interface for ATM (UTOPIA), using ATM protocol on the ASIC side and simplex optical interfaces using Synchronous Optical Network (SONET) protocol on the network side. Such a MAC device, commonly referred to as ATM/SONET Framer, provides one Receive and one Transmit interface to the network at various SONET line rates such as 155.52 Mbps (OC-3), 622.08 Mbps (OC-12), 2488.32 Mbps (OC-48), etc. The ATM and the SONET interfaces operate on different clock frequencies and thus represent two distinct clocking domains. The data interchange between the two clocking domains is achieved via FIFO buffer elements and associated control and status signals.

9 Claims, 2 Drawing Sheets

ATM/SONET Framer Architecture

OTHER PUBLICATIONS

Calderon et al., "Implementation of a SDH STM–N IC for B–ISDN using VHDL based synthesis tools", ACM, Sep. 1994.*

Genoe et al., "On the use of VHDL–based behavioral synthesis for telecom ASIC design", ACM, Sep. 1995.*

Silburt et al., "Accelerating concurrent hardware design with behavioral modeling and system simulation", ACM, Jan. 1995.*

IBM Technical Brochure—"High–Speed Protocol Controller for SONET/ATM Networks" vol. 35 No2 Jul. 1992.

* cited by examiner

ATM/SONET Framer Architecture

SONET OC-Nc Frame Structure

CUSTOMIZABLE SIMULATION MODEL OF AN ATM/SONET FRAMER FOR SYSTEM LEVEL VERIFICATION AND PERFORMANCE CHARACTERIZATION

TECHNICAL FIELD

The technical field of this invention relates to a customizable model of an ATM/SONET Framer for system level verification and performance characterization with programmable FIFO status update and clock domain synchronization.

BACKGROUND OF THE INVENTION AND PRIOR ART

A system level simulation requires use of behavioral models representing functionality of commercial off-the-shelf MAC devices from many vendors. Such behavioral models are generally not available from the device vendors. A solution to this problem commonly suggested by the device vendors is to use the actual Register Transfer Level (RTL) or gate level design MODEL implemented in a Hardware Description Language (HDL) such as Verilog or VHDL. However, using a non-behavioral model in a simulation results in significant degradation of simulation performance. Moreover, integration of the actual design model or vendor supplied behavioral model in the local simulation limits observability and controllability due to constraints stemming from the protection of proprietary data. A practical alternative to this problem is to develop an accurate custom behavioral model that offers sufficient parameters which can be programmed to represent framers from different vendors.

SUMMARY OF THE INVENTION

The present invention describes the architecture and implementation of a behavioral VHDL model of an ATM/SONET framer. The model is comprised of two independently configurable components, a Receiver and a Transmitter, and offers flexibility to allow testing with framers from multiple vendors by changing programmable parameters of the model.

The present invention represents a customizable simulation model of an ATM/SONET Framer for System Level Verification and Performance Characterization. An asynchronous Transfer Mode (ATM) data processing ASIC interfaces with a Media Access Control (MAC) device that presents an electrical data path interface, called Universal Test & Operations PHY Interface for ATM (UTOPIA), using ATM protocol on the ASIC side and simplex optical interfaces using synchronous Optical Network (SONET) protocol on the network side. Such a MAC device, commonly referred to as ATM/SONET Framer, provides one Receive and one Transmit interface to the network at various SONET line rates such as 155.52 Mbps (OC-3), 622.08 Mbps (OC-12), 2488.32 Mbps (OC-48), etc. The ATM and the SONET interfaces operate on different clock frequencies and thus represent two distinct clocking domains. The data interchange between the two clocking domains is achieved via FIFO buffer elements and associated control and status signals.

DETAILED DESCRIPTION OF THE PREFERRED EMBODIMENT

Before going into the details of the present invention, it would be quite helpful to the reader to have several terms of art defined. These are listed below:

Definitions

Sonet This is an acronym for Synchronous Optical Network. A category of fiber optic communication standards that permits extremely high speed transmission 51.84 Mbps to 24488 Mbps).

ATM This is referred to as an Asychronous Transfer Mode.

MAC is defined as the acronym, Media Access Control.

HDL is defined as the acronym, Hardware Description Language.

RTL is defined as the acronym, Register Transfer language.

VHDL & Verilog are considered as hardware description language.

As noted above, an Asynchronous Transfer Mode (ATM) data processing ASIC interfaces with a Media Access Control (MAC) device that presents an electrical data path interface, called Universal Test & Operations PHY Interface for ATM (UTOPIA), using ATM protocol on the ASIC side and simplex optical interfaces using Synchronous Optical Network (SONET) protocol on the network side. Such a MAC device, commonly referred to as ATM/SONET Framer, provides one Receive and one Transmit interface to the network at various SONET line rates such as 155.52 Mbps (OC-3), 622.08 Mbps (OC-12), 2488.32 Mbps (OC-48), etc. The ATM and the SONET interfaces operate on different clock frequencies and thus represent two distinct clocking domains. The data interchange between the two clocking domains is achieved via FIFO buffer elements and associated control and status signals.

A system level simulation requires use of behavioral models representing functionality of commercial off-the-shelf MAC devices from many vendors. Such behavioral models are generally not available from the device vendors. A solution to this problem commonly suggested by the device vendors is to use the actual Register Transfer Level (RTL) or gate level design implemented in a Hardware Description Language (HDL) such as Verilog or VHDL. However, using a non-behavioral model in a simulation results in significant degradation of simulation performance. Moreover, integration of the actual design model or vendor supplied behavioral model in the local simulation limits observability and controllability due to constraints stemming from the protection of proprietary data. A practical alternative to this problem is to develop an accurate custom behavioral model that offers sufficient parameters which can be programmed to represent framers from different vendors.

The present invention describes the architecture and implementation of a behavioral VHDL model of an ATM/SONET framer. The model is comprised of two independently configurable components, a Receiver and a Transmitter, and offers flexibility to allow testing with framers from multiple vendors by changing programmable parameters of the model.

Figure 1:
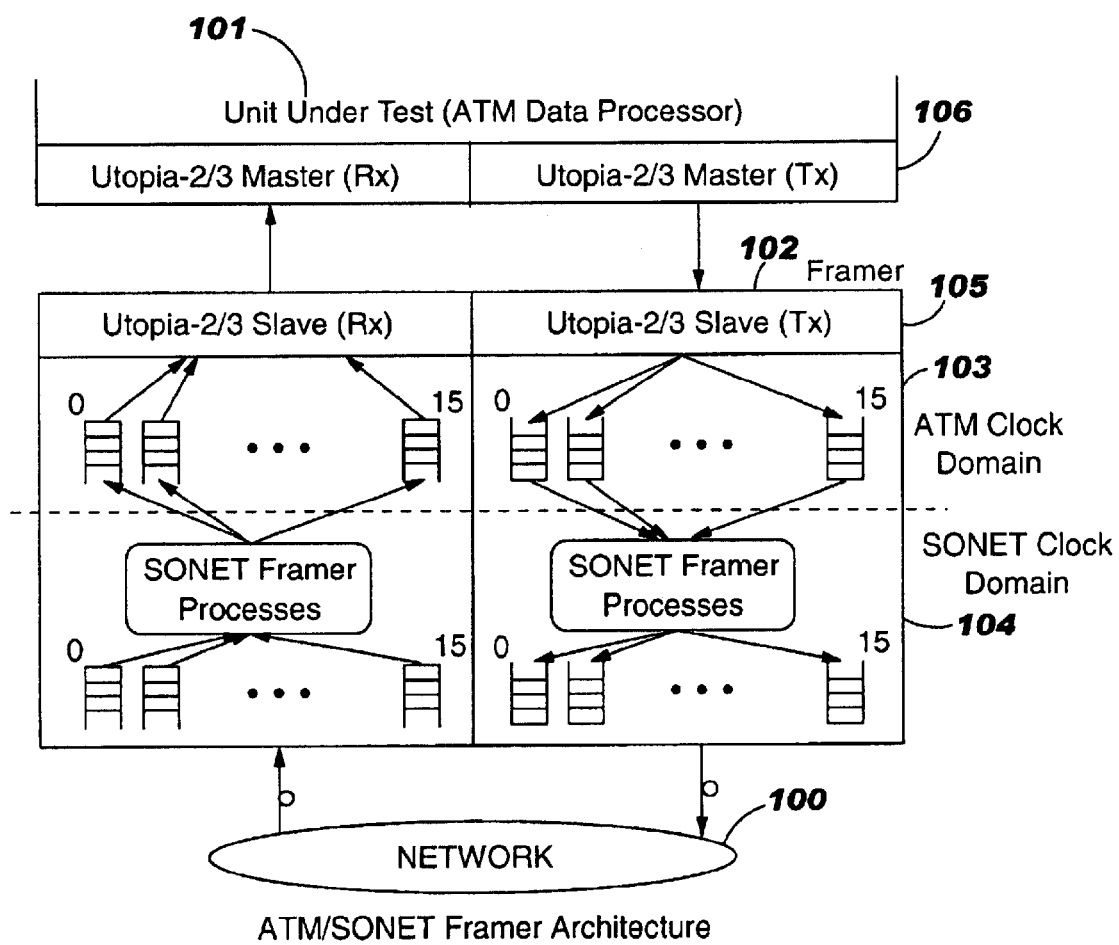
FIG. 1 This figure represents the basic architecture of the ATM/SONET FRAMER.

The present invention functions in the following manner. The basic architecture of the ATM/SONET FRAMER is shown in FIG. 1.

The invention offers the advantages of programmability, rich features set, and two independently configurable models, one each for transmit and receive side. The programmability of the models extends beyond what is necessary to capture the functionality of commercial vendor devices. The programmable features include:

SONET line rates (OC-Nc: N=1 . . . 48; OC-1=51.48 Mbps)

Percentage of data bytes vs. overhead bytes per row

Delays associated with clock domain synchronization

FIFO depth and threshold (in terms of number of cells)

Byte or word count threshold within a cell associated with FIFO status update

UTOPIA Level-2/3

Built-in performance checking.

Framer Transmit Model

Features

Insert ATM cells into a transmitted OC-Nc frame

Insert idle cells for rate adaptation

Provide interface setup and hold time checks

Provide performance check

Generate error messages if Utopia FIFO overrun or underrun during performance check Programmable Tx FIFO depth and threshold Latency associated with clock domain synchronization Programmable SONET rate.

Description

The basic architecture of the ATM/SONET FRAMER is shown in FIG. 1. The component represented as seen in the FIG. 1 are the network connections at location 100, the UUT (ATM Data Processor) at location 101, the Framer at 102, the ATM Clock Domain at location 103, the SONET Clock Domain at location 104.

FIG. 1, shows the implementation of transmit model, located at 105, which is implemented as a set of sixteen, per-port UTOPIA Tx FIFOs whose depth is settable by a generic parameter on the model, and a set of sixteen "virtual" network queues of infinite depth.

Figure 2:
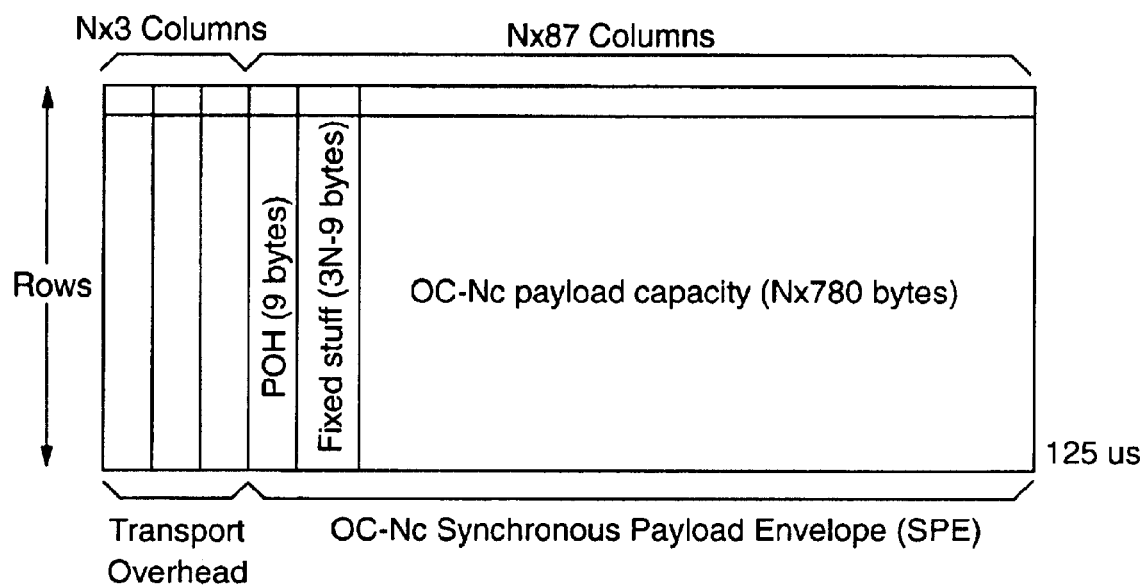
FIG. 2 This represents SONET OC-Nc FRAME Structure.

A UTOPIA Tx Level-2/3 physical bus interface process implements the utopia slave protocol and supports cell-level handshake and data transfer. Each cell received from the UTOPIA Master Tx, location at 106, interface on the ATM UUT is written into the appropriate per-port UTOPIA Tx FIFO in the framer. The cell is then read out of the UTOPIA Tx FIFO (into the corresponding "virtual" network queue) based on a SONET framer process which follows the SONET overhead and SONET payload envelope (SPE) structure as shown in FIG. 2. There is one framer process per UTOPIA port. Each framer process can be configured independent of the others. Since multiple framers in a real system will power-up at random times, each framer process uses a built-in random delay between zero ns and one row time before starting to generate the virtual OC-Nc frames.

These framer processes constitute the core of the transmit model. Each process is synchronous to the SONET byte clock (which is programmable via the line rate parameter), and maintains a count of the cells received into the corresponding UTOPIA Tx FIFO. The process mimics the SONET frame structure by maintaining a running count of the overhead bytes received for a row, the count of data bytes received for the cell, and the count of rows within the fixed 125 micro-second frame length. When the running count of data bytes received for a cell equals 53 the number of bytes in an ATM cell) the cell count in the UTOPIA Tx FIFO is decremented.

Since, the SONET frames length is independent of the SONET data rate and fixed at 125 micro-seconds, the parameters such as the number of bytes in a row and the number of bytes in SONET payload envelope can be modified by programming different values of the line rate, and/or the percentage of data bytes in a row. These values may be set from a test case via a procedure call to the framer model.

Many vendors' framers provide programmability In FIFO status update during Write and Read. A cell is generally not transmitted until the complete cell has been written into the Tx FIFO. The programmability feature allows the cell count to be Incremented before the entire cell Is physically transferred. This is specified in terms of number of words transferred across the UTOPIA interface. The model supports this programmability via a generic. Similarly, the cell count is decremented when a complete cell from Tx FIFO Is Inserted Into the SONET frame. The cell count can be decremented at a programmable byte count into the ATM cell structure. This feature is also supported via a different generic. Two additional generics have been included in the model to mimic the synchronization delay between ATM and SONET clock domains. These two generics represent the latency associated with propagation and registration of FIFO status (cell count) update across the ATM/SONET domain boundary in each direction.

This model can be programmed to handle UTOPIA Level-2/3 via a generic. Each port can be programmed to emulate a particular SONET line rate (0 to 2488.32 Mbps).

Framer Receive Model

Features

Extract ATM cells from the received OC-Nc frame format.

Strip idle cells

Purge enqueued cells

Provide interface setup and hold time checks Provide performance check on the line side Generate error messages if UTOPIA Rx FIFO overrun or underrun during performance check Programmable Rx FIFO depth and threshold Latency associated with clock domain synchronization Programmable SONET rate.

Description

As shown in FIG. 1, the SONET receive model is implemented as two logical sets of sixteen, per-port FIFOs. The sixteen network FIFOs are infinitely deep. The depth of UTOPIA Rx FIFOs defaults to a value of four cells, and can be modified via a procedure call.

ATM cells are enqueued to the receive model via a procedure call from a test case, and are placed in the appropriate per-port network FIFO. The cell is then read out of the network FIFO and written into the corresponding UTOPIA Rx FIFO based on a framer process which mimics the SONET overhead and payload envelope structure. There is one framer process for each port, and each framer process can be configured independently of the others. A UTOPIA Rx Level-2/3 physical bus interface process implements the slave protocol and supports cell-level handshake and forwards the cells from UTOPIA Rx FIFO to the UUT.

The framer processes are synchronous to the SONET byte clock, which is programmable via the line rate, and maintains a count of data bytes (versus overhead bytes) in a cell, and a count which represents the number of rows in a 125 micro-seconds SONET frame. On the simulation start-up, these processes delay a random amount of time (between 0 ns and one row time) before starting to emulate extraction of ATM cells from the SONET frame structure in order to mimic the random start of different framers.

A cell is received into the UTOPIA Rx FIFO and cell count incremented when the count of data bytes in a cell extracted from the SONET frame equals a generic parameter. The default value of this parameter is set to 53. Similarly, when the count of words in a cell which have been transferred across the UTOPIA Rx bus equals another generic, the count of cells in the UTOPIA Rx FIFO is decremented. The synchronization delay between ATM and SONET clock domains, observed in real framer implementations, is modeled by two additional generics. These two generics represent the latency associated with propagation and registration of FIFO status (cell count) update across the ATM/SONET domain boundary in each direction.

This model can be programmed to handle UTOPIA Level-2/3 via a generic. The model supports randomization of ATM cell payload. Each port can be programmed to emulate a particular SONET line rate (0 to 2488.32 Mbps).

While the invention has been described with respect to a specific embodiment, it will be obvious to those skilled in this art that changes in both form and/or detail may be made without a departure from the scope and/or spirit of the invention.

We claim:

1. A computer based system employing a customizable Simulation Model of an ATM/SONET Framer, for system level verification and performance characterization, comprising:

means for developing an accurate customizable behavioral model that offer sufficient parameters which can be programmed to represent Framers from different vendors, the ATM/SONET framer comprising a Receiver system;

a Transmitter system wherein said Receiver system and said Transmitter system are independently configurable and each includes a UTOPIA interface programmable to provide different protocols;

a first group of buffers operatively coupled to the UTOPIA interface;

SONET Framer Processes including a format translator; and a second group of buffers operatively coupled to the SONET Framer Processes.

2. The system of claim 1 wherein said ATM/SONET Framer provides at least one Receive and at least one Transmit interfaces to the network at a SONET line rate of 155.52 Mbps (OC-3), 622.08 Mbps (OC-12) and 2488.32 Mbps (OC-48).

3. The system of claim 1 wherein the first group of buffers and the Utopia interface are positioned in an ATM clock domain and the SONET Framer Processes and the second group of buffers are placed in a SONET clock domain.

4. The system of claim 3 wherein said ATM clock domain and said SONET clock domain operate on different clock frequencies and represent two distinct clock domains.

5. The system of claim 1 which in addition, offers programmability, rich feature set, and two independently configurable models, one each for said transmit side and said receive side, and offers said programmability features of:
SONET line rates (OC-Nc: N=1.48; OC-1=51.48 Mbps)
Percentage of data bytes vs. overhead bytes per row
Delays associated with clock domain synchronization
FIFO depth and threshold (in terms of number of cells)
Byte or word count threshold within a cell associated with FIFO status update
UTOPIA Level-2/3
Built-in performance checking.

6. A computer based method for system level verification and performance characterization of an ATM/SONET framer comprising providing a customizable behavioral model of an ATM/SONET Framer which includes independently configurable Receiver system and Transmitter system;

providing software for coacting with said behavioral model, said software including sufficient programmable parameters for representing Framers from different vendors; and activating selected ones of said programmable parameters which cause the model to behave as a framer from a particular framer manufacturer.

7. The method of claim 6 further including providing additional parameters, that causes the model to operate at different line rates.

8. The method of claim 7 further including activating selected ones of the additional parameters to cause the model to operate at one of a plurality of line rates.

9. The system of claim 1 wherein the format translator converts ATM cells to SONET packets and visa versa.

* * * * *